(12) United States Patent
Li et al.

(10) Patent No.: US 9,130,589 B2
(45) Date of Patent: Sep. 8, 2015

(54) LOW DENSITY PARITY CHECK DECODER WITH DYNAMIC SCALING

(71) Applicant: LSI Corporation, San Jose, CA (US)

(72) Inventors: Shu Li, Milpitas, CA (US); Zongwang Li, San Jose, CA (US); Shaohua Yang, San Jose, CA (US); Chung-Li Wang, San Jose, CA (US); Fan Zhang, Milpitas, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 125 days.

(21) Appl. No.: 13/777,841

(22) Filed: Feb. 26, 2013

(65) Prior Publication Data

US 2014/0173385 A1 Jun. 19, 2014

Related U.S. Application Data

(60) Provisional application No. 61/739,365, filed on Dec. 19, 2012.

(51) Int. Cl.

| | |
|---|---|
| *G11B 20/18* | (2006.01) |
| *H03M 13/13* | (2006.01) |
| *H03M 13/11* | (2006.01) |
| *H03M 13/00* | (2006.01) |
| *H03M 13/27* | (2006.01) |

(52) U.S. Cl.
CPC ....... *H03M 13/1117* (2013.01); *G11B 20/1833* (2013.01); *H03M 13/1111* (2013.01); *H03M 13/1171* (2013.01); *H03M 13/6331* (2013.01); *H03M 13/658* (2013.01); *G11B 2020/185* (2013.01); *H03M 13/27* (2013.01)

(58) Field of Classification Search
CPC ............ H03M 13/2957; H03M 13/45; H03M 13/1111; H03M 13/1102; H04L 1/0045
USPC ...................... 714/780, 752, E11.032; 360/32
See application file for complete search history.

(56) References Cited

U.S. PATENT DOCUMENTS

| | | | |
|---|---|---|---|
| 5,278,703 | A | 1/1994 | Rub et al. |
| 5,278,846 | A | 1/1994 | Okayama |
| 5,317,472 | A | 5/1994 | Schweitzer, III |
| 5,325,402 | A | 6/1994 | Ushirokawa |
| 5,392,299 | A | 2/1995 | Rhines |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Albert Decady
*Assistant Examiner* — Kyle Vallecillo
(74) *Attorney, Agent, or Firm* — Hamilton DeSanctis & Cha

(57) ABSTRACT

A data processing system is disclosed including a low density parity check decoder with a variable node processor, a check node processor and a scaler circuit. The low density parity check decoder is operable to scale soft information with a scaling factor in the scaler circuit while iteratively generating and processing check node to variable node messages in the variable node processor and variable node to check node messages in the check node processor between a plurality of check nodes and variable nodes. The scaling factor is derived from a distribution of possible values in an input to the low density parity check decoder.

20 Claims, 5 Drawing Sheets

(56) References Cited

U.S. PATENT DOCUMENTS

| | | | |
|---|---|---|---|
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,261,171 B2 | 9/2012 | Annampedu | |
| 8,286,048 B1* | 10/2012 | Chen et al. | 714/752 |
| 8,291,284 B2 | 10/2012 | Savin | |
| 8,295,001 B2 | 10/2012 | Liu | |
| 2006/0242093 A1* | 10/2006 | Richardson et al. | 706/15 |
| 2007/0297496 A1* | 12/2007 | Park et al. | 375/148 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2011/0167227 A1 | 7/2011 | Yang | |
| 2011/0258508 A1* | 10/2011 | Ivkovic et al. | 714/752 |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsšì: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

(56) References Cited

OTHER PUBLICATIONS

Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/113,219, filed May 23, 2011, Yang Han, Unpublished.
U.S. Appl. No. 13/227,544, filed Sep. 8, 2011, Shaohua Yang, Unpublished.
U.S. Appl. No. 13/283,549, filed Oct. 27, 2011, Wu Chang, Unpublished.
U.S. Appl. No. 13/269,832, filed Oct. 10, 2011, Haitao Xia, Unpublished.
U.S. Appl. No. 13/742,340, filed Jan. 15, 2013, Razmik Karabed, Unpublished.
U.S. Appl. No. 13/186,234, filed Jul. 19, 2011, Haitao Xia, Unpublished.
U.S. Appl. No. 13/227,416, filed Sep. 7, 2011, Lei Chen, Unpublished.
U.S. Appl. No. 13/296,022, filed Nov. 14, 2011, Victor Krachkovsky, Unpublished.
U.S. Appl. No. 13/174,537, filed Jun. 30, 2011, Anantha Raman Krishnan, Unpublished.
U.S. Appl. No. 13/180,495, filed Jul. 11, 2011, Chung-Li Wang, Unpublished.
U.S. Appl. No. 13/171,615, filed Jun. 29, 2011, Bradley D. Seago, Unpublished.
U.S. Appl. No. 13/284,767, filed Oct. 28, 2011, Fan Zhang, Unpublished.
U.S. Appl. No. 13/239,683, filed Sep. 22, 2011, Changyou Xu, Unpublished.
U.S. Appl. No. 13/174,453, filed Jun. 30, 2011, Johnson Yen, Unpublished.
U.S. Appl. No. 13/545,833, filed Jul. 10, 2012, Zhi Bin Li, Unpublished.
U.S. Appl. No. 13/445,878, filed Apr. 12, 2012, Yu Liao, Unpublished.
U.S. Appl. No. 13/989,583, filed Oct. 15, 2012, Shaohua Yang, Unpublished.
U.S. Appl. No. 13/284,730, filed Oct. 28, 2011, Fan Zhang, Unpublished.
U.S. Appl. No. 13/742,336, filed Jan. 15, 2013, Jianzhong Huang, Unpublished.
U.S. Appl. No. 13/213,751, filed Aug. 19, 2011, Fan Zhang, Unpublished.
U.S. Appl. No. 13/741,003, filed Jan. 14, 2013, Lu Lu, Unpublished.
U.S. Appl. No. 13/670,393, filed Nov. 6, 2012, Lei Chen, Unpublished.
U.S. Appl. No. 13/363,751, filed Feb. 1, 2012, Lei Chen, Unpublished.
U.S. Appl. No. 13/445,834, filed Apr. 12, 2012, Chung-Li Wang, Unpublished.
U.S. Appl. No. 13/433,693, filed Mar. 29, 2012, Fan Zhang, Unpublished.
U.S. Appl. No. 13/596,819, filed Aug. 28, 2012, Shaohua Yang, Unpublished.
U.S. Appl. No. 13/596,947, filed Aug. 28, 2012, Fan Zhang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/619,907, filed Sep. 14, 2012, Fan Zhang, Unpublished.
U.S. Appl. No. 13/621,341, filed Sep. 17, 2012, Shaohua Yang, Unpublished.
U.S. Appl. No. 13/597,026, filed Aug. 28, 2012, Fan Zhang, Unpublished.
U.S. Appl. No. 13/622,294, filed Sep. 18, 2012, Fan Zhang, Unpublished.
U.S. Appl. No. 13/327,279, filed Dec. 15, 2011, Wei Feng, Unpublished.
U.S. Appl. No. 13/295,150, filed Nov. 14, 2011, Zongwang Li, Unpublished.
U.S. Appl. No. 13/305,510, filed Nov. 28, 2011, Lei Chen, Unpublished.
U.S. Appl. No. 13/369,468, filed Feb. 9, 2012, Zongwang Li, Unpublished.
U.S. Appl. No. 13/340,951, filed Dec. 30, 2011, Lei Chen, Unpublished.
U.S. Appl. No. 13/340,974, filed Dec. 30, 2011, Dan Liu, Unpublished.
U.S. Appl. No. 13/474,660, filed May 17, 2012, Zongwang Li, Unpublished.
U.S. Appl. No. 13/302,119, filed Nov. 22, 2011, Lei Chen, Unpublished.
U.S. Appl. No. 13/300,078, filed Nov. 18, 2011, Chung-Li Wang, Unpublished.
U.S. Appl. No. 13/305,551, filed Nov. 28, 2011, Yang Han, Unpublished.
U.S. Appl. No. 13/316,741, filed Dec. 12, 2011, Yang Han, Unpublished.
U.S. Appl. No. 13/316,858, filed Dec. 12, 2011, Zongwang Li, Unpublished.
U.S. Appl. No. 13/362,409, filed Jan. 31, 2012, Fan Zhang, Unpublished.
U.S. Appl. No. 13/445,848, filed Apr. 12, 2012, Bruce Wilson, Unpublished.
U.S. Appl. No. 13/412,520, filed Mar. 5, 2012, Fan Zhang, Unpublished.
U.S. Appl. No. 13/426,714, filed Mar. 22, 2012, Shaohua Yang, Unpublished.
U.S. Appl. No. 13/372,580, filed Feb. 14, 2012, Fan Zhang, Unpublished.
U.S. Appl. No. 13/269,852, filed Oct. 10, 2011, Haitao Xia, Unpublished.
U.S. Appl. No. 13/422,986, filed Mar. 16, 2012, Fan Zhang, Unpublished.
Vasic, B., "High-Rate Girth—Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

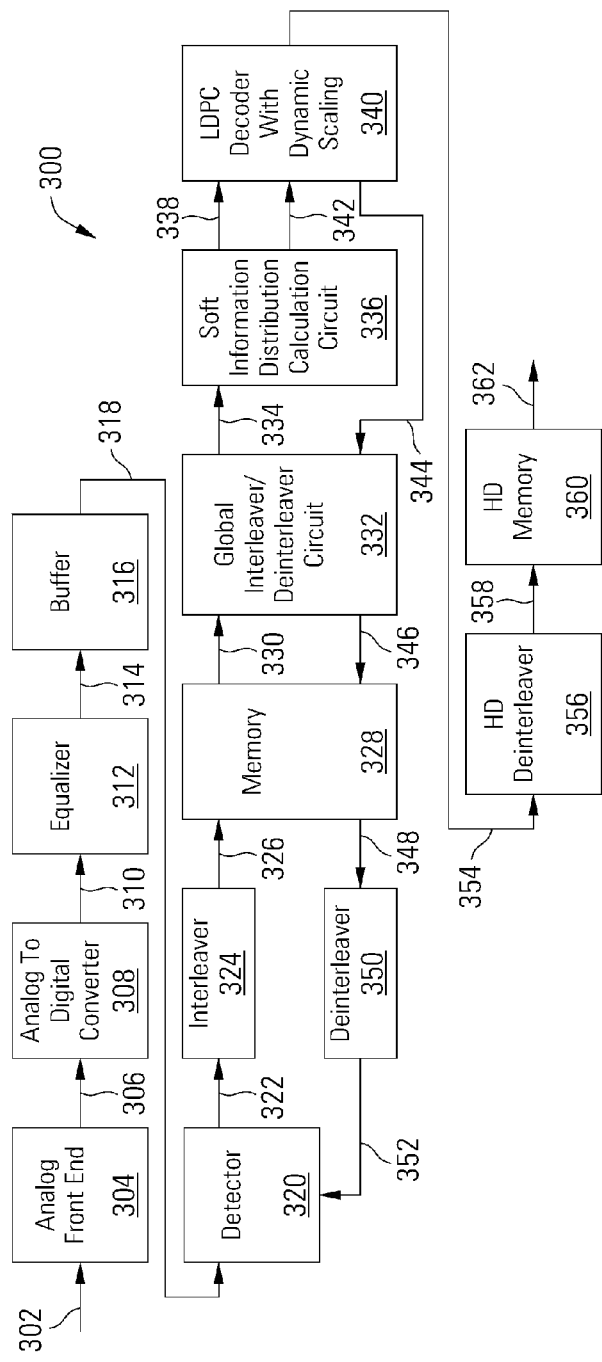
FIG. 3
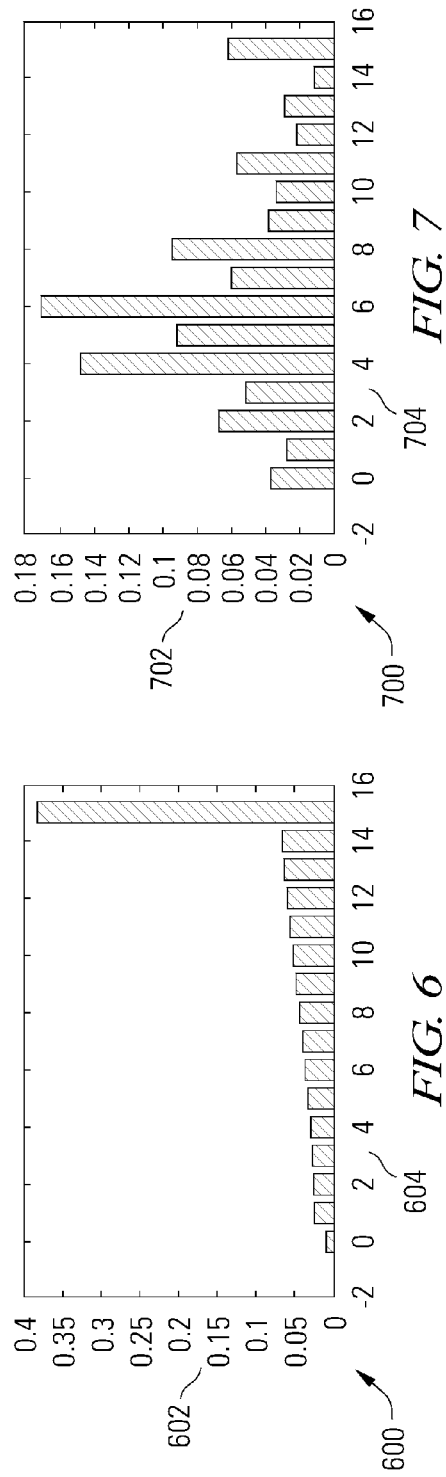
FIG. 7
FIG. 6

LOW DENSITY PARITY CHECK DECODER WITH DYNAMIC SCALING

CROSS REFERENCE TO RELATED APPLICATIONS

The present application claims priority to (is a non-provisional of) U.S. Pat. App. No. 61/739,365, entitled "Low Density Parity Check Decoder With Dynamic Scaling", and filed Dec. 19, 2012 by Li et al, the entirety of which is incorporated herein by reference for all purposes.

FIELD OF THE INVENTION

Various embodiments of the present inventions provide apparatuses and methods for low density parity check decoding with dynamic scaling.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error correction systems have been developed to detect and correct errors in digital data, encoding the data in the sender and decoding in the receiver to recover the originally written data.

SUMMARY

A data processing system is disclosed including a low density parity check decoder with a variable node processor, a check node processor and a scaler circuit. The low density parity check decoder is operable to scale soft information with a scaling factor in the scaler circuit while iteratively generating and processing check node to variable node messages in the variable node processor and variable node to check node messages in the check node processor between a plurality of check nodes and variable nodes. The scaling factor is derived from a distribution of possible values in an input to the low density parity check decoder.

This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

FIG. 3 depicts a block diagram of a read channel with a low density parity check decoder with dynamic scaling which may be used to retrieve or receive stored or transmitted data in accordance with some embodiments of the present invention;

FIG. 6 depicts a distribution chart of values in data to be decoded by a low density parity check decoder with dynamic scaling in accordance with some embodiments of the present invention;

FIG. 7 depicts a distribution chart of scaled values in data to be decoded by a low density parity check decoder with dynamic scaling in accordance with some embodiments of the present invention;

DETAILED DESCRIPTION OF THE INVENTION

A low density parity check (LDPC) decoder with dynamic scaling applies a scaling factor to data values as they are decoded. The scaling factor is based on a statistical analysis of the distribution of data values in a data set to be decoded. In some embodiments, a statistical analysis circuit is provided outside the low density parity check decoder to analyze the distribution of data values before they enter the low density parity check decoder. In other embodiments, a statistical analysis circuit is provided inside the low density parity check decoder. In some embodiments, the scaling factor is used to dynamically scale data values as they pass from check nodes to variable nodes in the low density parity check decoder. In other embodiments, the scaling factor is used to dynamically scale data values as they pass from variable nodes to check nodes in the low density parity check decoder. By dynamically scaling data values during low density parity check decoding, the distribution of data values in the data set being decoded is controlled to improve decoding performance.

The low density parity check decoder with dynamic scaling may be, but is not limited to, a multi-level (non-binary) decoder, and may be a layer or non-layer decoder for regular or irregular low density parity check codes. Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as dynamic random-access memory, negated-AND flash, negated-OR flash, other non-volatile memories and solid state drives.

Figures 1, 2:
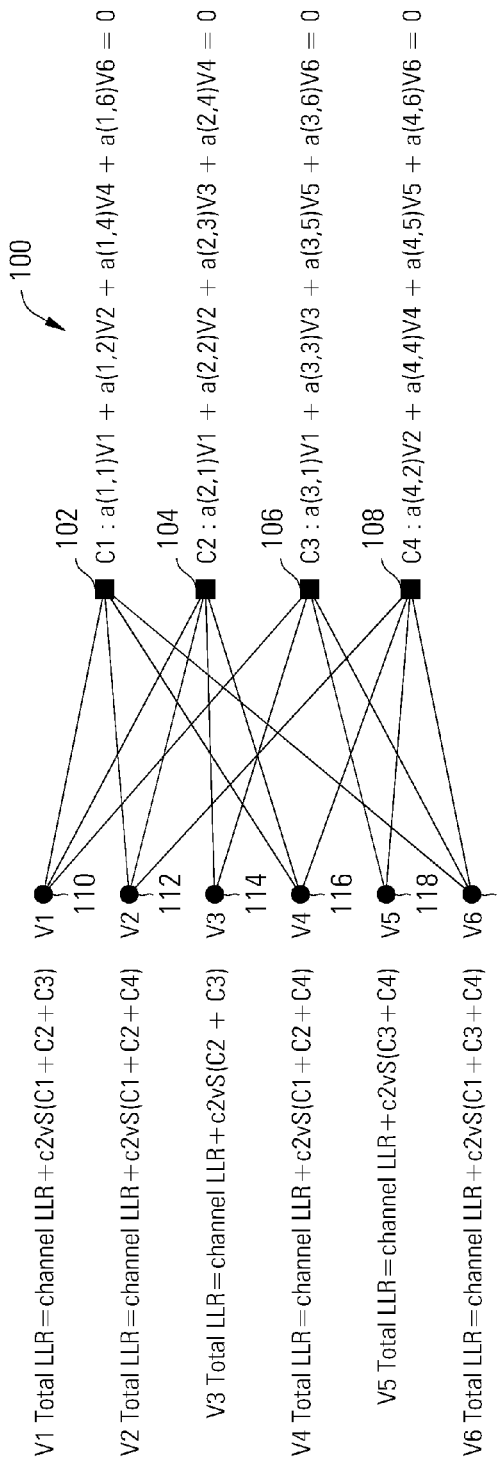
FIG. 1 depicts a Tanner graph of a low density parity check code that may be decoded in a low density parity check code decoder with dynamic scaling in accordance with some embodiments of the present invention.
FIG. 2 depicts a parity check H matrix for a low density parity check decoder with dynamic scaling in accordance with one or more embodiments of the present invention.

A low density parity check code is a parity-based code that can be visually represented in a Tanner graph 100 as illustrated in FIG. 1. In a low density parity check decoder, multiple parity checks are performed in a number of check nodes 102, 104, 106 and 108 for a group of variable nodes 110, 112, 114, 116, 118, 120. The connections (or edges) between variable nodes 110-120 and check nodes 102-108 are selected as the low density parity check code is designed, balancing the strength of the code against the complexity of the decoder required to execute the low density parity check code as data is obtained. The number and placement of parity bits in the group are selected as the low density parity check code is designed. Messages are passed between connected variable nodes 110-120 and check nodes 102-108 in an iterative decoding process, passing beliefs about the values that should appear in variable nodes 110-120 to connected check nodes 102-108. Parity checks are performed in the check nodes 102-108 based on the messages and the results are returned to connected variable nodes 110-120 to update the beliefs if necessary. In a non-binary low density parity check decoder, variable nodes 110-120 contain symbols from a Galois Field, a finite field $GF(p^k)$ that contains a finite number of elements, characterized by size $p^k$ where p is a prime number and k is a positive integer. The beliefs about the values that should appear in variable nodes 110-120 are represented as soft information, containing a likelihood or probability for each possible value of a variable node that the corresponding possible value is the correct value for the variable node. In some embodiments of a GF(4) decoder, the soft information for a given variable node includes four probability values, one for each of the four possible values of the variable node, with each probability value giving the likelihood that the corresponding possible value is the correct value of the variable node, and with the sum of the four probability values being 1.

Messages in the non-binary low density parity check decoder are multi-dimensional soft information vectors, generally either plain-likelihood probability vectors or log likelihood ratio vectors. Embodiments of the low density parity check decoder with dynamic scaling disclosed herein scale the soft information probability values, adjusting the distribution of soft information probability values to facilitate convergence.

The connections between variable nodes 110-120 and check nodes 102-108 may be presented in matrix form as follows, where columns represent variable nodes and rows represent check nodes. A random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & a(1,2) & 0 & a(1,4) & 0 & a(1,6) \\ a(2,1) & a(2,2) & a(2,3) & a(2,4) & 0 & 0 \\ a(3,1) & 0 & a(3,3) & 0 & a(3,5) & a(3,6) \\ 0 & a(4,2) & 0 & a(4,4) & a(4,5) & a(4,6) \end{bmatrix}$$

The H matrix above is the parity check matrix for a simple irregular low density parity check code, including both weight-2 and weight 3 columns. Notably, the low density parity check decoder with dynamic scaling is not limited to any particular column weights. In the H matrix above, columns 1, 2, 4 and 6 are weight-3 columns, meaning that the variable nodes corresponding to columns 1, 2, 4 and 6 are each connected to three check nodes. Columns 3 and 5 are weight-2 columns, meaning that the variable nodes corresponding to columns 3 and 5 are each connected to two check nodes. Each non-zero value in the H matrix is a non-zero value on GF(q), which may have a value from 0 to q−1.

By providing multiple check nodes 102-108 for the group of variable nodes 110-120, redundancy in error checking is provided, enabling errors to be corrected as well as detected. Each check node 102-108 performs a parity check on bits or symbols passed as messages from its neighboring (or connected) variable nodes. In the example low density parity check code corresponding to the Tanner graph 100 of FIG. 1, check node 102 checks the parity of variable nodes 110, 112, 116, and 120. Values are passed back and forth between connected variable nodes 110-120 and check nodes 102-108 in an iterative process until the LDPC code converges on a value for the group of data and parity bits in the variable nodes 110-120. For example, the total log likelihood ratio value of variable node 110 is calculated based on the channel log likelihood ratio value and messages from check nodes 102, 104 and 106. Variable node 110 passes messages to check nodes 102, 104 and 106. Check node 102 passes messages back to variable nodes 110, 112, 116 and 120. The messages between variable nodes 110-120 and check nodes 102-108 are probabilities or beliefs, thus the low density parity check decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-120 and check nodes 102-108, with the values in the nodes 102-120 being adjusted based on the messages that are passed, until the values converge and stop changing or until processing is halted.

Dynamic scaling of soft information may be applied at any suitable location in the low density parity check decoder, such as, but not limited to, messages passed from check nodes to variable nodes. In embodiments in which the messages from check nodes to variable nodes are dynamically scaled, the total log likelihood ratio values for variable nodes may be calculated as shown in FIG. 1, where the total log likelihood ratio value for a variable node is equal to the channel (or input) log likelihood ratio value, plus the scaled sum of the soft information in messages from connected check nodes. Because variable node V1 110 is connected to check node C1 102, check node C2 104 and check node C3 106, and given a scaling factor c2vS, the total log likelihood ratio value for variable node V1 110=channel log likelihood ratio for variable node V1 110+c2vS (C1+C2+C3), where C1, C2 and C3 denote the soft information in messages from check node C1 102, check node C2 104 and check node C3 106 to variable node V1 110.

The low density parity check decoder used in various embodiments may implement any suitable decoding algorithm. Check nodes in a low density parity check decoder receive incoming messages from connected or neighboring variable nodes and generate outgoing messages to each neighboring variable node to implement the parity check matrix for the low density parity check code. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message for each neighboring variable node.

In some embodiments, the low density parity check decoder performs min-sum based decoding of low density parity check codes. Min-sum based decoding may be performed by initializing the log likelihood ratio value of each variable node $v_n$ at iteration k=1 to $L_n^0 = L_{nm}^0$. The check nodes $c_m$ are updated using the min-sum approximation of Equation 1, where L is the soft information probability value, k is the local iteration number, m is the check node index and n is the variable node index:

$$L_{mn,MS}^k = \left( \prod_{n' \in B(m) \backslash n} \text{sign}(L_{n'm}^{k-1}) \right) \cdot \min_{n' \in B(m) \backslash n} |L_{n'm}^{k-1}| \quad \text{(Eq 1)}$$

The k-th output of variable node $v_n$ is calculated according to Equation 2:

$$L_n^k = L_n^0 + \sum_{m \in A(n)} L_{mn}^k \quad \text{(Eq 2)}$$

The variable node $v_n$ is updated according to Equation 3:

$$L_{nm}^k = L_n^k - L_{mn}^k \quad \text{(Eq 3)}$$

The iteration index k is incremented and the iterative process continues by updating check nodes $c_m$ using the min-sum approximation of Equation 1. Thus, the feedback soft information from check nodes to variable nodes is added onto the variable node's soft information to generate the updated hard decision and soft information for generating variable node to check node messages.

In the low density parity check decoder with dynamic scaling, a scaling factor is applied to the soft information, either on the edges from variable nodes to check nodes of on the edges from check nodes to variable nodes. The scaling factor is calculated to adjust the distribution of values in the soft information so that decoding is improved. In an embodiment in which a scaling factor c2vS is applied on edges from check nodes to variable nodes, Equation 2 is modified as shown in Equation 4:

$$L_n^k = L_n^0 + c2vS \times \sum_{m \in A(n)} L_{mn}^k \quad \text{(Eq 4)}$$

where $L_n^k$ is the total log likelihood ratio soft information for variable node $v_n$, $L_n^0$ is the channel soft information at the input to the low density parity check decoder, A(n) is the set of extrinsic check node inputs to the variable node $v_n$, and c2vS is the scaling factor that is generated based on a statistical analysis of the channel soft information. The scaling factor c2vS thus scales the soft information on the edges from check nodes to variable nodes, as the total log likelihood ratio values are calculated to update the variable node values. Based upon the disclosure provided herein, one of ordinary skill in the art will recognize a variety of techniques for applying the scaling factor to soft information during decoding that may be used in relation to different embodiments of the present inventions. In some embodiments, the scaling factor is applied to soft information for connected check nodes before they are summed and the total log likelihood ratio values are calculated. In other embodiments, the scaling factor is applied to the sum of soft information for connected check nodes before the total log likelihood ratio values are calculated. In yet other embodiments, the scaling factor is applied on soft information from variable nodes before check node calculations are performed.

Turning to FIG. 2, a parity check H matrix 200 for a low density parity check decoder with dynamic scaling is depicted in accordance with one or more embodiments of the present invention. The H matrix 200 shows the connections between variable nodes (e.g., 216, 220), represented by columns, and check nodes (e.g., 206, 210), represented by rows. Each bit or symbol in the data set being decoded is assigned to a variable node. Parity bits or symbols in the data set are shown in the parity portion 202 of the H matrix 200, and user data bits or symbols are shown in the user portion 204 of the H matrix 200, although the parity bits or symbols and the user data bits or symbols may be distributed in any suitable manner though the H matrix 200. Variable node values are updated based on inputs from check nodes connected to each variable node. Parity checks are performed in check nodes based on values passed from variable nodes connected to each check node. An "X" in a cell (e.g., 212) of the H matrix 200 represents a non-zero value in the cell, indicating that the variable node associated with the cell's column is connected to the check node associated with the cell's row, and an empty cell (e.g., 214) represents a zero value in the cell, indicating that the variable node associated with the cell's column is not connected to the check node associated with the cell's row. Although dynamic scaling is applicable to both regular and irregular low density parity check decoders, the H matrix 200 of FIG. 2 is an irregular low density parity check code, including both weight-2 columns (e.g., 220) and weight-3 columns (e.g., 216), meaning that the variable node of column 220 is connected to two check nodes and the variable node of column 216 is connected to three check nodes. The data set is decoded iteratively in the low density parity check with dynamic scaling, in some embodiments progressing layer by layer through the H matrix 200, beginning with the first layer 206 and ending the local decoding iteration with the last layer 210.

Any suitable low density parity check decoder can be used to implement the dynamic scaling disclosed herein, such as, but not limited to, a min-sum based low density parity check decoder. Based upon the disclosure provided herein, one of ordinary skill in the art will recognize a variety of low density parity check decoders that may be used in relation to different embodiments of the present invention.

Although the low density parity check decoder with dynamic scaling is not limited to any particular application, several examples of applications are presented herein that benefit from embodiments of the present invention. Turning to FIG. 3, a read channel 300 is used to process an analog signal 302 and to retrieve user data bits from the analog signal 302 without errors. In some cases, analog signal 302 is derived from a read/write head assembly in a magnetic storage medium. In other cases, analog signal 302 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 302 may be derived.

The read channel 300 includes an analog front end 304 that receives and processes the analog signal 302. Analog front end 304 may include, but is not limited to, an analog filter and an amplifier circuit as are known in the art. Based upon the disclosure provided herein, one of ordinary skill in the art will recognize a variety of circuitry that may be included as part of analog front end 304. In some cases, the gain of a variable gain amplifier included as part of analog front end 304 may be modifiable, and the cutoff frequency and boost of an analog filter included in analog front end 304 may be modifiable. Analog front end 304 receives and processes the analog signal 302, and provides a processed analog signal 306 to an analog to digital converter 308.

Analog to digital converter 308 converts processed analog signal 306 into a corresponding series of digital samples 310. Analog to digital converter 308 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 310 are provided to an equalizer 312. Equalizer 312 applies an equalization algorithm to digital samples 310 to yield an equalized output 314. In some embodiments of the present invention, equalizer 312 is a digital finite impulse response filter circuit as is known in the art. Data or codewords contained in equalized output 314 may be stored in a buffer 316 until a data detector 320 is available for processing.

The data detector 320 performs a data detection process on the received input 318, resulting in a detected output 322. In some embodiments of the present invention, data detector 320 is a Viterbi algorithm data detector circuit, or more particularly in some embodiments, a maximum a posteriori (MAP) data detector circuit as is known in the art. In some of these embodiments, the detected output 322 contains log likelihood ratio soft information about the likelihood that each bit or symbol has a particular value. Based upon the disclosure provided herein, one of ordinary skill in the art will recognize a variety of data detectors that may be used in relation to different embodiments of the present invention. Data detector 320 is started based upon availability of a data set in buffer 316 from equalizer 312 or another source.

The detected output 322 from data detector 320 is provided to a local interleaver 324 that protects data against burst errors. Burst errors overwrite localized groups or bunches of bits. Because low density parity check decoders are best suited to correcting errors that are more uniformly distributed, burst errors can overwhelm low density parity check decoders. The interleaver 324 prevents this by interleaving or shuffling the detected output 322 from data detector 320 to yield an interleaved output 326 which is stored in a memory 328. The interleaved output 330 from the memory 328 is provided to a global interleaver/deinterleaver circuit 332, which may be any circuit known in the art that is capable of globally rearranging codewords. A globally interleaved output 334 from global interleaver/deinterleaver circuit 332 is provided to a soft information distribution calculation circuit 336.

The soft information distribution calculation circuit 336 performs a statistical analysis of the soft information in the globally interleaved output 334, yielding a scaling factor 342 based upon the statistical distribution of the probability values in the soft information in the globally interleaved output 334. The scaling factor 342 is provided to a low density parity check decoder with dynamic scaling 340, along with globally interleaved decoder input 338 containing an interleaved version of the detected output 322 from data detector 320. The soft information distribution calculation circuit 336 may implement any statistical operation that characterizes the distribution of possible value probabilities in the soft information, such as, but not limited to, the mean, variance, median or standard deviation of values in the soft information. The soft information distribution calculation circuit 336 gathers or accumulates the soft information values over the data set being decoded, such as over a data sector read from a magnetic hard drive.

The derivation or generation of the scaling factor 342 is based on experimental data for a particular low density parity check decoder design in some embodiments, calculating a new scaling factor 342 and/or determining whether to apply the scaling factor 342 based on the statistical characteristics of the soft information for a data set at each global iteration. In some embodiments, the variance of the distribution of probability values in soft information can be found to be related to decoding efficiency, with higher variances generally corresponding to better decoding efficiency. In such embodiments, a scaling factor 342 may be generated that increases the variance of the distribution of probability values, with the scaling factor 342 applied when the variance of soft information probability values in the globally interleaved output 334 is below a threshold.

In some embodiments, the scaling factor 342 includes a different scaling factor for each of the possible values in the distribution for the data sector. For example, in a GF(16) decoder with 16 possible values, the soft information distribution will include a probability for each of the 16 possible values indicating the likelihood that the possible value is the correct value, averaged over the entire data sector. In these embodiments, a different scaling factor is provided for each of the 16 possible values. If any of the probabilities for a symbol in a variable node exceed a threshold value, the scaling factors are applied to each of the 16 probabilities, decreasing the probabilities that exceed the threshold value and increasing the probabilities that are below the threshold value. This increases the variance in the distribution, spreading the highest likelihood of the correct symbol over more possible symbol values. This prevents the decoder from getting stuck on an incorrect value that has been assigned a very high probability, and enables the check nodes to more easily overcome an incorrect value during the iterative decoding operation.

In some embodiments, the median of the distribution of probability values in the soft information can be found to be related to decoding efficiency, with a median placed somewhere near the middle possible log likelihood ratio value generally corresponding to better decoding efficiency and medians placed near the upper or lower possible log likelihood ratio values generally corresponding to lower decoding efficiency. In such embodiments, a scaling factor 342 may be generated that shifts the median of the distribution of probability values in the soft information closer to the middle possible log likelihood ratio value.

In some embodiments, the scaling factor 342 is a predetermined value that is either applied or not applied during a decoding operation based on the statistical characteristics of the soft information. In other embodiments, the value of the scaling factor 342 is based on the statistical characteristics of the soft information, for example being proportional to the variance and/or the median of the probability distribution in the soft information.

The low density parity check decoder with dynamic scaling 340 performs parity checks on the decoder input 338, ensuring that parity constraints established by a low density parity check encoder (not shown) before storage or transmission are satisfied in order to detect and correct any errors that may have occurred in the data during storage or transmission or during processing by other components of the read channel 300. The low density parity check decoder with dynamic scaling 340 applies the scaling factor 342 to soft information values during decoding to improve decoding performance based on the statistical characteristics of the decoder input 338.

Multiple detection and decoding iterations may be performed in the read channel 300, referred to herein as global iterations. (In contrast, local iterations are decoding iterations performed within the low density parity check decoder with dynamic scaling 340.) To perform a global iteration, log likelihood ratio values 344 from the low density parity check decoder with dynamic scaling 340 are globally deinterleaved in global interleaver/deinterleaver circuit 332, reversing the global interleaving process performed earlier, to yield deinterleaved decoder output 346, which is stored in memory 328. The stored globally interleaved decoder output 348 is deinterleaved in a local deinterleaver 350 to reverse the process applied by interleaver 324, yielding deinterleaved decoder output 352, and provided again to the data detector 320 to allow the data detector 320 to repeat the data detection process, aided by the log likelihood ratio values in deinterleaved decoder output 352. In this manner, the read channel 300 can perform multiple global iterations, allowing the data detector 320 and low density parity check decoder with dynamic scaling 340 to converge on the correct data values.

The low density parity check decoder with dynamic scaling 340 also produces hard decisions 354 about the values of the data bits or symbols in decoder input 338. In a GF(4) embodiment of a low density parity check decoder, the hard decisions are represented by four field elements 00, 01, 10 and 11.

The hard decisions 354 from low density parity check decoder with dynamic scaling 340 are deinterleaved in a hard decision deinterleaver 356, reversing the process applied in interleavers 324 and 332, yielding deinterleaved hard decisions 358. The deinterleaved hard decisions 358 are stored in a hard decision memory 360 before being provided to a user or further processed. For example, the output 362 of the read channel 300 may be further processed to reverse formatting changes applied before storing data in a magnetic storage medium or transmitting the data across a transmission channel.

In some other embodiments, the soft information distribution calculation circuit 336 is integrated within the low density parity check decoder with dynamic scaling 340, analyzing the statistical distribution of the soft information in the decoder input 338 and generating the scaling factor 342 within the low density parity check decoder with dynamic scaling 340.

Figure 4:
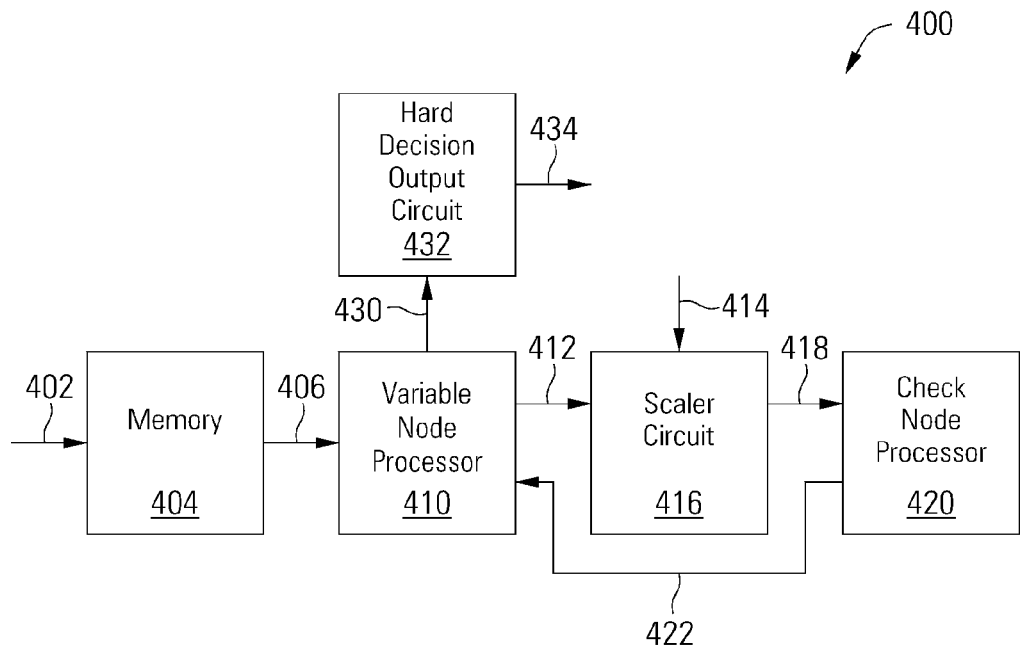
FIG. 4 depicts a block diagram of a low density parity check decoder with dynamic scaling on a check node to variable node edge in accordance with some embodiments of the present invention.

Turning to FIG. 4, a low density parity check decoder with dynamic scaling 400 is depicted in accordance with some embodiments of the present invention. The low density parity check decoder with dynamic scaling 400 is not limited to any particular algorithm for parity check calculations or message generation techniques. In the low density parity check decoder with dynamic scaling 400, data bits or symbols are stored in variable nodes as they are decoded, and parity checks are performed in a number of check nodes. The connections (or edges) between variable nodes and check nodes are selected as the low density parity check code is designed. Messages are passed between connected variable nodes and check nodes in an iterative process, passing beliefs about the values that should appear in variable nodes to connected check nodes. Parity checks are performed in the check nodes based on the messages and the results are returned to connected variable nodes to update the beliefs if necessary. Messages in a non-binary low density parity check decoder are multi-dimensional vectors, generally either plain-likelihood probability vectors or log likelihood ratio vectors.

Input data 402 to the low density parity check decoder with dynamic scaling 400 is stored in a memory 404. Input data 402 includes soft values representing variable node value probabilities. Probability values 406 from memory 404 are provided to a variable node processor 410, which generates variable node to check node messages 412 containing probability values for the perceived value of each bit or symbol. The variable node to check node messages 412 are scaled by a scaling factor 414 in a scaler circuit 416, which multiplies the probability values in variable node to check node messages 412 by the scaling factor 414 to yield scaled variable node to check node messages 418. A check node processor 420 receives the scaled variable node to check node messages 418 and performs parity check calculations for each check node based on messages from connected variable nodes. The check node processor 420 also generates check node to variable node messages 422, enabling the variable node processor 410 to update the perceived value for each variable node based on check node to variable node messages 422 from connected check nodes. By adjusting the soft information by the scaling factor 414, the statistical distribution of possible variable node values is adjusted to improve decoding performance.

In a min-sum based low density parity check decoder, the check node processor 420 selects the lowest (or minimum) log likelihood ratio values and feeds them back to the connected variable nodes with sign adjustment. Updated variable node values may also be updated in the memory 404 during local decoding iterations, either by the variable node processor 410 or check node processor 420 or both. Probability values 430 from the variable node processor 410 may also be provided to a hard decision output circuit 432 which generates a hard decision output 434.

In the embodiment shown in FIG. 4, the statistical distribution of possible variable node values in decoder input 402 is analyzed in a soft information distribution calculation circuit (e.g., 336) outside the low density parity check decoder with dynamic scaling 400. The external soft information distribution calculation circuit generates the scaling factor 414 as an input (e.g., 342) to the low density parity check decoder with dynamic scaling 400. In some other embodiments, a soft information distribution calculation circuit (not shown) is integrated within the low density parity check decoder with dynamic scaling 400, analyzing the statistical distribution of the soft information in the decoder input 402 and generating the scaling factor 414 within the low density parity check decoder with dynamic scaling 400.

In the embodiment shown in FIG. 4, the scaling factor 414 is applied on edges from the variable nodes to the check nodes. In another embodiment of a low density parity check decoder with dynamic scaling 500 shown in FIG. 5, the scaling factor 526 is applied on edges from the check nodes to the variable nodes, implementing Equation 4. The low density parity check decoder with dynamic scaling 500 is not limited to any particular algorithm for parity check calculations or message generation techniques. In the low density parity check decoder with dynamic scaling 500, data bits or symbols are stored in variable nodes as they are decoded, and parity checks are performed in a number of check nodes.

Input data 502 to the low density parity check decoder with dynamic scaling 500 is stored in a memory 504. Input data 502 includes soft values representing variable node value probabilities. Probability values 506 from memory 504 are provided to a variable node processor 510, which generates variable node to check node messages 512 containing probability values for the perceived value of each bit or symbol. A check node processor 520 receives the variable node to check node messages 512 and performs parity check calculations for each check node based on messages from connected variable nodes. The check node processor 520 generates check node to variable node messages 522, which are scaled by a scaling factor 526 in a scaler circuit 524. Scaler circuit 524 multiplies the probability values in check node to variable node messages 522 by the scaling factor 526 to yield scaled check node to variable node messages 528. The variable node processor 510 updates the perceived value for each variable node based on scaled check node to variable node messages 528 from connected check nodes. Perceived variable node values may also be updated in the memory 504 during local decoding iterations, either by the variable node processor 510 or check node processor 520 or both. When updating the perceived variable node values, the variable node processor 510 calculates the total log likelihood ratio value based on the channel soft information in decoder input 502, adding the sum of the scaled soft information from the connected check nodes contained in the scaled check node to variable node messages 528, according to Equation 4. When generating the variable node to check node messages 512, the variable node processor 510 subtracts from the total log likelihood ratio value the previous scaled check node to variable node message from the check node for which the variable node to check node message is being prepared, leaving only extrinsic inputs in the message.

Probability values 530 from the variable node processor 510 may also be provided to a hard decision output circuit 532 which generates a hard decision output 534. By adjusting the soft information by the scaling factor 526, the statistical distribution of possible variable node values is adjusted to improve decoding performance. The statistical analysis is repeated at each global iteration, dynamically tailoring the scaling factor to be applied in the low density parity check decoder to the distribution characteristics of the soft information of each global iteration.

Figure 5:
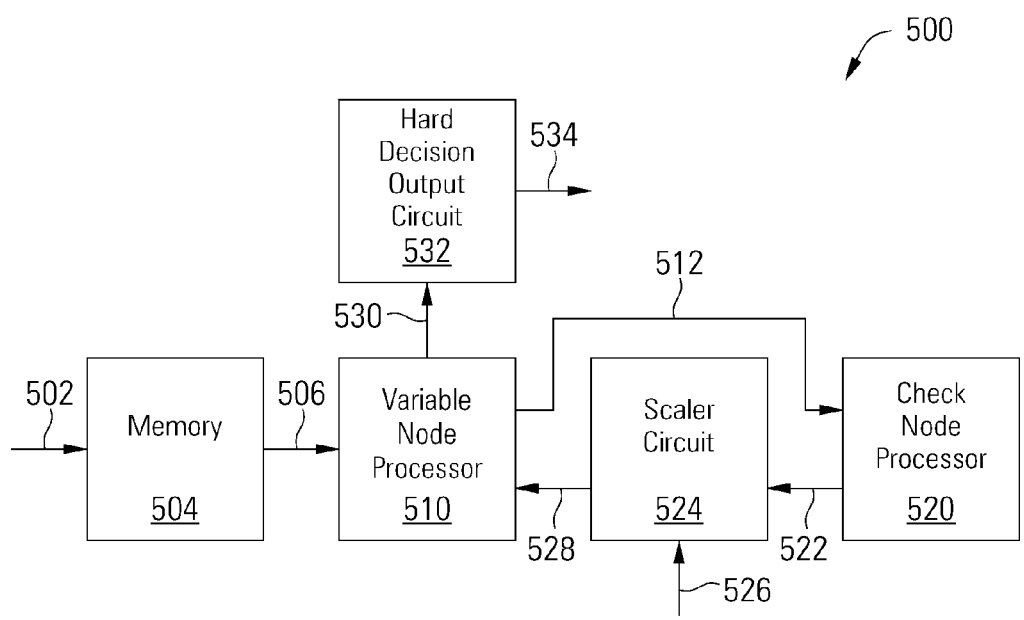
FIG. 5 depicts a block diagram of a low density parity check decoder with dynamic scaling on a variable node to check node edge in accordance with some embodiments of the present invention.

In the embodiment shown in FIG. 5, the statistical distribution of possible variable node values in decoder input 502 is analyzed in a soft information distribution calculation circuit (e.g., 336) outside the low density parity check decoder with dynamic scaling 500. The external soft information distribution calculation circuit generates the scaling factor 526 as an input (e.g., 342) to the low density parity check decoder with dynamic scaling 500. In some other embodiments, a soft information distribution calculation circuit (not shown) is integrated within the low density parity check decoder with dynamic scaling 500, analyzing the statistical distribution of the soft information in the decoder input 502 and generating the scaling factor 526 within the low density parity check decoder with dynamic scaling 500.

Turning to FIGS. 6 and 7, charts of the distribution of soft information at the input to a low density parity check with dynamic scaling are shown in accordance with some embodiments of the present invention. In FIG. 6, a chart 600 depicts a distribution of soft information, with probability values on the Y axis 602 and the possible values of each data symbol on the X axis 604. In this embodiment, each symbol has 16 possible values, from 0 to 15. If the probability value of each possible value or bar along the X axis 604 were totaled, the total probability value would be 1, or 100 percent. Notably, in the example distribution shown in FIG. 6, the variance is relatively low, that is, the higher probability values are closely grouped, in this case with value 15 having a much higher probability of being the correct value of the symbol than any of the other values. Furthermore, the median of the distribution is skewed toward the higher values which in some embodiments of a low density parity check decoder with dynamic scaling correlates with reduced decoding efficiency.

Turning to FIG. 7, a chart 700 depicts a distribution of soft information which has been adjusted by applying a scaling factor to the soft information, with probability values on the Y axis 702 and the possible values of symbol on the X axis 704. In this embodiment, each symbol has 16 possible values, from 0 to 15. If the probability value of each possible value or bar along the X axis 704 were totaled, the total probability value would be 1, or 100 percent. Notably, in the example distribution shown in FIG. 7, the variance has been increased, spreading the probability of the correct value for the symbol across more possible values, and the median of the distribution has been shifted further toward the middle values. This helps the iterative decoding operation to better change perceived values of symbols in variable nodes. With lower probability values or log likelihood ratio values, the variable nodes are less likely to get stuck on an incorrect value, and updates from connected check nodes will be more likely to be able to override and change an incorrect value, increasing decoding efficiency.

Figure 8:
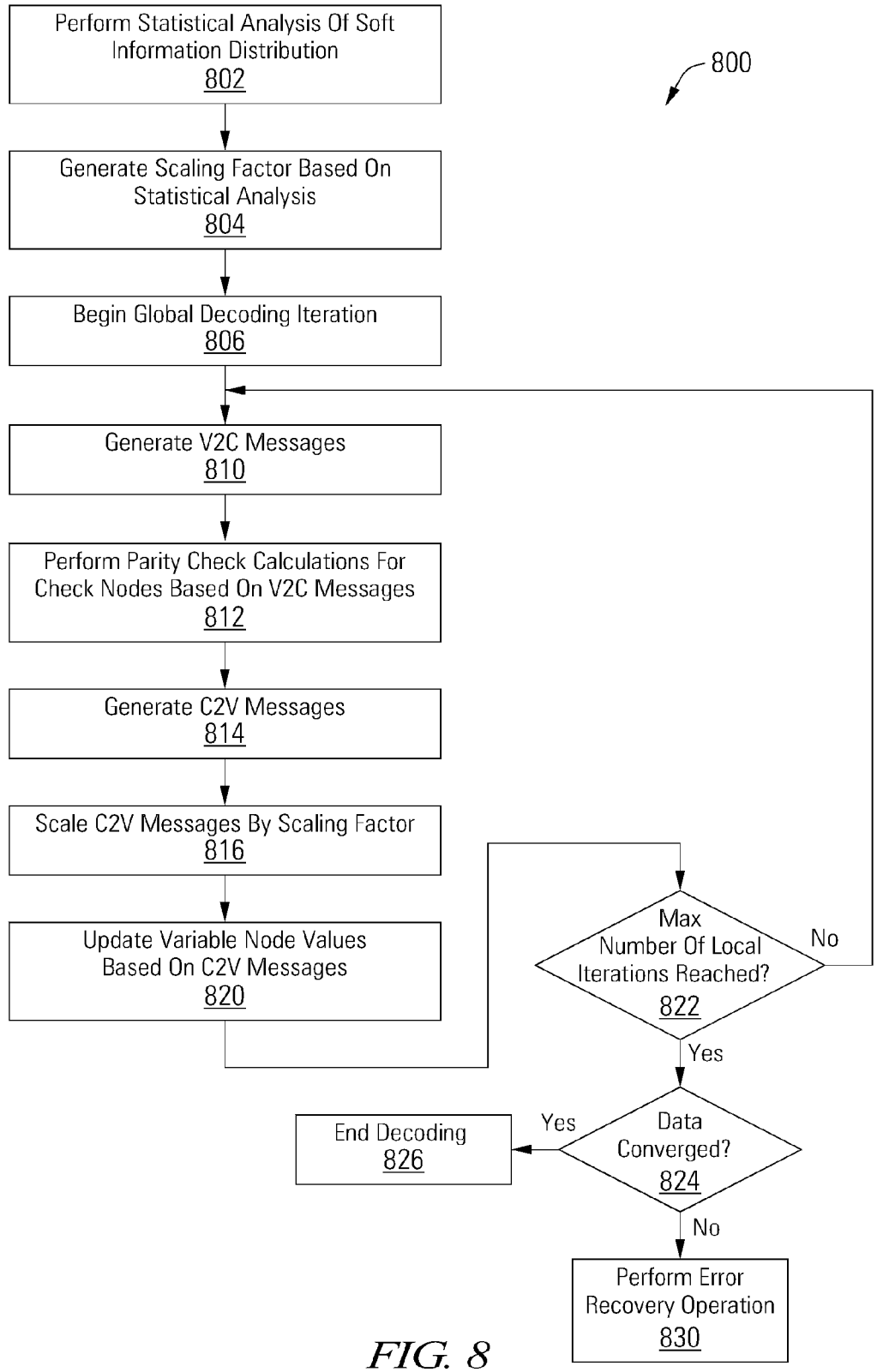
FIG. 8 depicts a flow diagram showing a method for dynamically scaling data during low density parity check decoding in accordance with various embodiments of the present invention.

Turning to FIG. 8, a flow diagram 800 depicts an operation for dynamically scaling data during low density parity check decoding in accordance with some embodiments of the present invention. Following flow diagram 800, a statistical analysis of the distribution of possible value probabilities in soft information at a decoder input is performed. (Block 802) In some embodiments, this is performed in a soft data distribution calculation circuit outside the low density parity check decoder. In other embodiments, this is performed in a soft data distribution calculation circuit inside the low density parity check decoder. The statistical analysis is any statistical operation that characterizes the distribution of possible value probabilities in the soft information, such as, but not limited to, the mean, variance, median or standard deviation of the distribution. A scaling factor is generated based on the statistical analysis. (Block 804) The relationship between the scaling factor and the results of the statistical analysis is dependent on the design of the low density parity check decoder and the expected channel conditions. The scaling factor adjusts the distribution of possible value probabilities in the soft information from a distribution that results in relatively poor decoding efficiency, for example as shown in FIG. 6, producing a distribution that results in relatively good decoding efficiency, for example as shown in FIG. 7. The global decoding iteration is begun. (Block 806) Variable node to check node messages are generated. (Block 810) In some embodiments, variable node to check node messages are generated in a variable node processor based on perceived values of data symbols in data being decoded and on scaled check node to variable node messages from a previous local decoding iteration. Parity check calculations are performed for check nodes based on the variable node to check node messages received at each check node. (Block 812) Check node to variable node messages are generated. (Block 814) Check node to variable node messages may be generated, for example, in a check node processor based on the parity check calculations. The check node to variable node messages are scaled by the scaling factor. (Block 816) Variable node values are updated based on the check node to variable node messages. (Block 820) If the maximum number of local iterations has not been reached (block 822), the next local iteration is performed. Otherwise, a determination is made as to whether the data converged in the low density parity check decoder. (Block 824) If the data converged, decoding is finished and hard decisions may be provided at an output of the low density parity check decoder with dynamic scaling. (Block 826) If the data failed to converge, one or more error recovery operations may be performed (block 830), such as targeted symbol flipping, in an effort to further assist the data to converge on the correct values.

Figure 9:
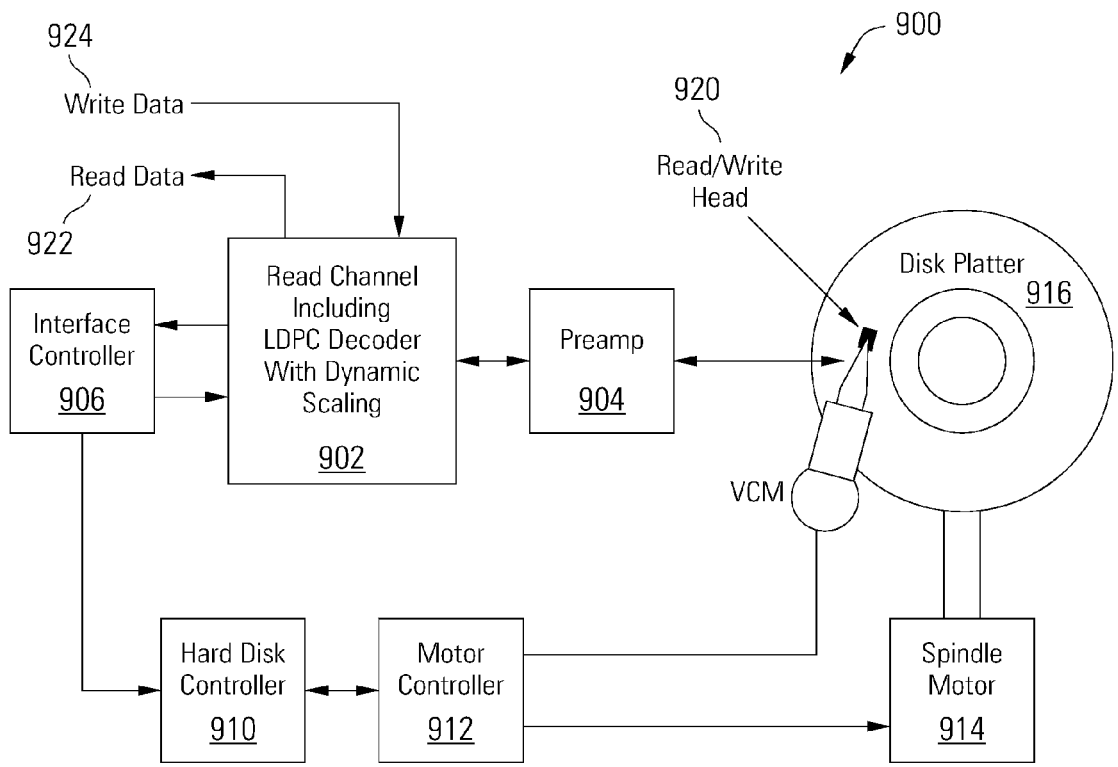
FIG. 9 depicts a storage system including a low density parity check decoder with dynamic scaling in accordance with some embodiments of the present invention.

Turning to FIG. 9, a storage system 900 is illustrated as an example application of a low density parity check decoder with dynamic scaling in accordance with some embodiments of the present invention. The storage system 900 includes a read channel circuit 902 with a low density parity check decoder with dynamic scaling in accordance with some embodiments of the present invention. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head assembly 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly 920 to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 decodes and digitizes the received analog signal to recreate the information originally written to disk platter 916. This data is provided as read data 922 to a receiving circuit. As part of processing the received information, read channel circuit 902 performs a data decoding process on the received signal using a low density parity check decoder with dynamic scaling. Such a low density parity check decoder with dynamic scaling may be implemented consistent with the disclosure above in relation to FIGS. 1-7. In some cases, the data decoding with dynamic scaling may be performed consistent with the flow diagram disclosed above in relation to FIG. 8. A write operation is substantially the opposite of the preceding read operation with write data 924 being provided to read channel circuit 902 and written to disk platter 916.

It should be noted that storage system 900 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 900, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 10:
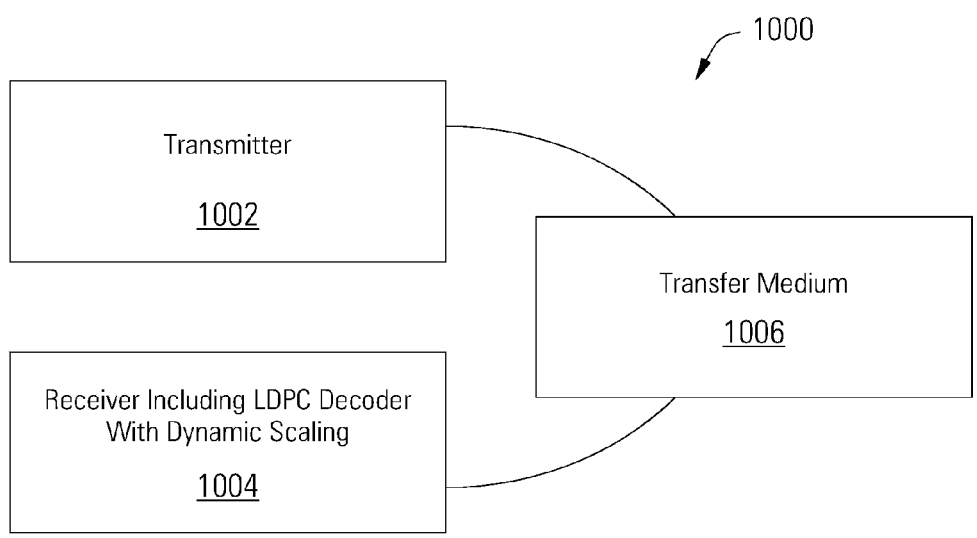
FIG. 10 depicts a wireless communication system including a low density parity check decoder with dynamic scaling in accordance with some embodiments of the present invention.

Turning to FIG. 10, a wireless communication system 1000 or data transmission device including a transmitter 1002 and receiver 1004 with a low density parity check decoder with dynamic scaling is shown in accordance with some embodiments of the present invention. Communication system 1000 includes a transmitter 1002 that is operable to transmit encoded information via a transfer medium 1006 as is known in the art. The encoded data is received from transfer medium 1006 by receiver 1004. Receiver 1004 incorporates a low density parity check decoder with dynamic scaling. Such a low density parity check decoder with dynamic scaling may be implemented consistent with the disclosure above in relation to FIGS. 1-7. In some cases, the data decoding with dynamic scaling may be performed consistent with the flow diagram disclosed above in relation to FIG. 8.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses and methods for low density parity check decoding with dynamic scaling. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
a low density parity check decoder comprising a variable node processor, a check node processor and a scaler circuit, wherein the low density parity check decoder is operable to scale soft information with a scaling factor in the scaler circuit while iteratively processing check node to variable node messages in the variable node processor and variable node to check node messages in the check node processor between a plurality of check nodes and variable nodes, wherein the scaling factor is derived from a distribution of possible values in an input to the low density parity check decoder, and wherein the scaling factor shifts probability values of each possible value of each symbol as it is decoded in the low density parity check decoder so that a median of a distribution of the possible values is shifted toward a middle one of the possible values and increases a variance of the distribution.

2. The data processing system of claim 1, wherein the soft information comprises the check node to variable node messages.

3. The data processing system of claim 1, wherein the soft information comprises the variable node to check node messages.

4. The data processing system of claim 1, wherein the distribution of possible values is analyzed by a soft information distribution calculation circuit to generate the scaling factor, and wherein the soft information distribution calculation circuit is operable to apply a statistical analysis algorithm selected from a group consisting of mean, median, variance, and standard deviation.

5. The data processing system of claim 1, further comprising a soft information distribution calculation circuit operable to analyze the distribution of possible values in the input to the low density parity check decoder.

6. The data processing system of claim 1, wherein the low density parity check decoder further comprises a soft information distribution calculation circuit operable to analyze the distribution of possible values in the input to the low density parity check decoder.

7. The data processing system of claim 1, further comprising a detector circuit operable to process a data input to generate a detected output as the input to the low density parity check decoder, wherein the detected output comprises soft information representing probabilities of possible values for data symbols.

8. The data processing system of claim 7, wherein the scaling factor is updated for each of a plurality of global decoding iterations.

9. The data processing system of claim 1, wherein the scaling factor is operable to increase a variance of the distribution of possible values in an input to the low density parity check decoder.

10. The data processing system of claim 9, wherein the scaling factor comprises a plurality of scaling factors, one for each possible value in a Galois Field for the low density parity check decoder.

11. The data processing system of claim 10, wherein the plurality of scaling factors are operable to reduce a probability of possible values in the Galois Field that exceeds a threshold value and to increase the probability of possible values in the Galois Field that do not exceed the threshold value.

12. The data processing system of claim 1, wherein the data processing system is implemented as part of a device selected from a group consisting of a storage device and a receiving device.

13. The data processing system of claim 1, wherein the data processing system is implemented as an integrated circuit.

14. A method of decoding data, comprising:
analyzing in a hardware decoder a statistical distribution of possible values of data symbols in a data set;
generating a scaling factor based on the statistical distribution; and
applying a decoding algorithm in the hardware decoder to the data set to identify correct values of the data symbols in the data set, while scaling soft information for the data set with the scaling factor, wherein the scaling factor shifts probability values of each possible value of each symbol as it is decoded in the hardware decoder so that a median of a distribution of the possible values is shifted toward a middle one of the possible values and increases a variance of the distribution.

15. The method of claim 14, wherein scaling the soft information comprises scaling soft information from check nodes to variable nodes.

16. The method of claim 14, wherein scaling the soft information comprises scaling soft information from variable nodes to check nodes.

17. The method of claim 14, wherein analyzing the statistical distribution comprises performing an operation to determine a characteristic selected from a group consisting of a mean, a median, a variance and a standard deviation.

18. The method of claim 14, wherein generating the scaling factor comprises generating a scaling factor for each of the possible values of the data symbols in the data set.

19. The method of claim 18, wherein scaling the soft information is operable to reduce a probability of the possible values that are greater than a threshold and to increase a probability of the possible values that are less than the threshold.

20. A storage system comprising:
a storage medium;
a head assembly disposed in relation to the storage medium and operable to provide a sensed signal corresponding to information on the storage medium;
an analog to digital converter circuit operable to sample an analog signal derived from the sensed signal to yield a series of digital samples; and
a data processing system operable to identify correct values for the digital samples, comprising:
a data detector circuit operable to apply a data detection algorithm to the digital samples to yield a detected output; and
a low density parity check decoder operable to apply a decoding algorithm to the detected output and to scale soft information with a scaling factor while iteratively generating and processing check node to variable node messages and variable node to check node messages between a plurality of check nodes and variable nodes, wherein the scaling factor is derived from a distribution of possible values in the detected output, wherein the scaling factor shifts probability values of each possible value of each symbol as it is decoded in the low density parity check decoder so that a median of a distribution of the possible values is shifted toward a middle one of the possible values and increases a variance of the distribution.

\* \* \* \* \*